(12) United States Patent
Cao et al.

(10) Patent No.: US 10,128,152 B2
(45) Date of Patent: *Nov. 13, 2018

(54) MAGNETIC TRAP FOR CYLINDRICAL DIAMAGNETIC MATERIALS

(71) Applicant: International Business Machines Corporation, Armonk, NY (US)

(72) Inventors: Qing Cao, Yorktown Heights, NY (US); Oki Gunawan, Fair Lawn, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/298,756

(22) Filed: Oct. 20, 2016

(65) Prior Publication Data

US 2017/0040217 A1    Feb. 9, 2017

Related U.S. Application Data

(63) Continuation of application No. 15/168,580, filed on May 31, 2016, now Pat. No. 9,576,853, which is a
(Continued)

(51) Int. Cl.
*H01F 7/02*  (2006.01)
*H01F 7/00*  (2006.01)
(Continued)

(52) U.S. Cl.
CPC ..... *H01L 21/76897* (2013.01); *H01F 7/0236* (2013.01); *H01F 7/0247* (2013.01);
(Continued)

(58) Field of Classification Search
CPC .... H01F 7/0247; H01F 7/0236; H01F 7/0231; H01F 7/02; H01F 7/00; H01F 7/0284; H01F 7/202; G01D 5/12; Y10S 977/762
See application file for complete search history.

(56) References Cited

U.S. PATENT DOCUMENTS 3,493,274 A    2/1970    Emslie et al.
3,629,753 A    12/1971    Kawabe
(Continued)

OTHER PUBLICATIONS

B. K. Sarker, et al.; "Semiconducting Enriched Carbon Nanotube Aligned Arrays of Tunable Density and Their Electrical Transport Properties", ACS nano 5, 6297 (2011).
(Continued)

*Primary Examiner* — Mohsen Ahmadi
(74) *Attorney, Agent, or Firm* — Cantor Colburn LLP; Vazken Alexanian

(57) ABSTRACT

A magnetic trap is configured to arrange at least one diamagnetic rod. The magnetic trap includes first and second magnets on a substrate that forms the magnetic trap defining a template configured to self-assemble diamagnetic material. Each of the first and second magnets extends along a longitudinal direction to define a magnet length, and contact each other to define a contact line. The first magnet and the second magnet have a diametric magnetization in a direction perpendicular to the contact line and the longitudinal direction so as to generate a longitudinal energy potential that traps the diamagnetic rod along the longitudinal direction.

10 Claims, 9 Drawing Sheets

Related U.S. Application Data continuation of application No. 14/743,051, filed on Jun. 18, 2015, now Pat. No. 9,236,293, which is a continuation of application No. 14/537,060, filed on Nov. 10, 2014, now Pat. No. 9,263,669, which is a continuation-in-part of application No. 13/969,333, filed on Aug. 16, 2013, now Pat. No. 8,895,355, which is a continuation of application No. 13/800,918, filed on Mar. 13, 2013, now Pat. No. 9,093,377.

(51) Int. Cl.
| | |
|---|---|
| *H01F 7/20* | (2006.01) |
| *G01D 5/24* | (2006.01) |
| *H01L 21/768* | (2006.01) |
| *H01L 43/12* | (2006.01) |
| *H01L 21/02* | (2006.01) |
| *H01L 21/283* | (2006.01) |
| *H01L 21/66* | (2006.01) |
| *H01L 23/532* | (2006.01) |
| *B82Y 40/00* | (2011.01) |

(52) U.S. Cl.
CPC ..... *H01F 7/0273* (2013.01); *H01L 21/02697* (2013.01); *H01L 21/283* (2013.01); *H01L 21/76838* (2013.01); *H01L 21/76892* (2013.01); *H01L 22/10* (2013.01); *H01L 23/53276* (2013.01); *H01L 43/12* (2013.01); *B82Y 40/00* (2013.01); *G01D 5/24* (2013.01); *H01F 7/00* (2013.01); *H01F 7/02* (2013.01); *H01F 7/0284* (2013.01); *H01F 7/202* (2013.01); *H01L 2221/1094* (2013.01); *H01L 2924/0002* (2013.01); *Y10S 977/762* (2013.01); *Y10T 29/41* (2015.01)

(56) References Cited

U.S. PATENT DOCUMENTS

| | | | |
|---|---|---|---|
| 6,356,177 B1 | | 3/2002 | Ogura |
| 6,653,920 B1* | | 11/2003 | Chen ............... H01F 7/0205 335/296 |
| 6,761,871 B2 | | 7/2004 | Little |
| 6,790,425 B1 | | 9/2004 | Smalley et al. |
| 6,987,302 B1 | | 1/2006 | Chen et al. |
| 7,131,537 B2 | | 11/2006 | Papadimitrakopoulos |
| 7,651,944 B2 | | 1/2010 | Duan et al. |
| 7,959,974 B2 | | 6/2011 | Mirkin et al. |
| 8,258,663 B2 | | 9/2012 | Smoot et al. |
| 8,277,667 B2* | | 10/2012 | Yang ............... B81B 3/0021 205/122 |
| 8,895,355 B2 | | 11/2014 | Cao |
| 9,093,377 B2 | | 7/2015 | Cao |
| 9,236,293 B2 | | 1/2016 | Cao |
| 9,263,669 B2 | | 2/2016 | Cao |
| 9,424,971 B2 | | 8/2016 | Cao |
| 2006/0056993 A1* | | 3/2006 | Gombinsky ........ F15B 15/1476 417/321 |
| 2007/0170798 A1 | | 7/2007 | Gohin et al. |
| 2009/0160279 A1* | | 6/2009 | Baur .................... F16C 32/04 310/90.5 |
| 2011/0024719 A1 | | 2/2011 | Sridhar et al. |
| 2011/0144478 A1 | | 6/2011 | Zabow et al. |
| 2012/0062061 A1 | | 3/2012 | Belisle |

OTHER PUBLICATIONS

D. A. Walters et al., "In-plane-aligned membranes of carbon nanotubes," Chemical Physics Letters, vol. 338, Issue 1, Apr. 13, 2001, pp. 14-20.

G. Kustler, "Diamagnetic levitation-Historical milestones," Revue Roumaine Des Sciences Techniques Serie Electrotechnique Et Energetique 52, 265 (2007); 18 pages.

H. Park et al.; "High-density integration of carbon nanotubes via chemical self-assembly;" Nature Nanotechnology Letters; Oct. 28, 2012; DOI: 10.1038/NNANO.2012.189; 5 pages.

K. J. Sun et al., "Magnetic property measurements on single wall carbon nanotube polyimide composites," J. Appl. Phys., vol. 103, 2008, 023908, 6 pages.

M. C. LeMieux, et al.; "Self-sorted, aligned nanotube networks for thin-film transistors", Science 321, 101 (2008).

M. Engel, et al.; Thin film nanotube transistors based on self-assembled, aligned, semiconducting carbon nanotube arrays, Acs Nano 2, 2445 (2008).

M. F. Islam et al., "Magnetic heterogeneity and alignment of single wall carbon nanotubes," Phys. Rev. B, vol. 71, 2005, 201401(R), 4 pages.

O. Gunawan, et al. "Measurement of carrier mobility in silicon nanowires", Nano letters 8, 1566 (2008).

S. J. Kang et al., "High-performance electronics using dense, perfectly aligned arrays of single-walled carbon nanotubes," Nature Nanotechnology 2, 230 (2007); 34 pages.

K. Li et al., "Langmuir-Blodgett assembly of densely aligned single-walled carbon nanotubes from bulk materials," Journal of the American Chemical Society 129, 4890 (2007); 3 Pages.

Y. Ma et al., "The production of horizontally aligned single-walled carbon nanotubes," Carbon, vol. 49, Issue 13, Nov. 2011, pp. 4098-4110.

Qing Cao et al., "Magnetic Trap for Cylindrical Diamagnetic Materials", U.S. Appl. No. 15/168,580, filed May 31, 2016.

List of IBM Patents of Patent Applications Treated as Related; (Appendix P), Filed Dec. 19, 2016; 2 pages.

* cited by examiner

MAGNETIC TRAP FOR CYLINDRICAL DIAMAGNETIC MATERIALS

DOMESTIC PRIORITY

This application is a continuation of U.S. patent application Ser. No. 15/168,580, filed May 31, 2016, which is a continuation of U.S. patent application Ser. No. 14/743,051, filed Jun. 18, 2015, now U.S. Pat. No. 9,236,293, which is a continuation of U.S. patent application Ser. No. 14/537,060, filed Nov. 10, 2014, now U.S. Pat. No. 9,263,669, which is a continuation-in-part of U.S. patent application Ser. No. 13/969,333, filed Aug. 16, 2013, now U.S. Pat. No. 8,895,355, which is a continuation of U.S. patent application Ser. No. 13/800,918, filed Mar. 13, 2013, now U.S. Pat. No. 9,093,377, the disclosures of which are incorporated by reference herein in their entireties.

BACKGROUND

Embodiments of the invention relate generally to trapping cylindrical diamagnetic materials and, in particular, to positioning diamagnetic materials in a contactless manner by magnets.

Miniaturization of semiconductor circuits has led to the fabrication of transistor devices on a smaller and smaller scale. At the end of scaling technology is a quasi one-dimensional structure, such as semiconductor nanowires or carbon nanotubes. Semiconductor nanowires can be fabricated using traditional lithography technology. However they are prohibitively expensive as the device scale becomes very small, such as less than five nanometers (nm) in diameter. In some applications, semiconductor wires or carbon nanotubes are synthesized using various processes, such as chemical vapor deposition (CVD), which wires or nanotubes can be harvested and subsequently fabricated to serve as a semiconductor device.

One of the key challenges in utilizing semiconductor wires or carbon nanotubes is to assemble them in large amounts and in precise locations on a substrate to serve as an integrated circuit with a method suitable for large scale manufacturing.

SUMMARY

According to one embodiment of the invention, a system for self-aligning diamagnetic materials includes first and second magnets contacting each other along a contact line and having a diametric magnetization perpendicular to the contact line and a diamagnetic rod positioned to levitate above the contact line of the first and second magnets.

According to another embodiment of the invention, a method of arranging a diamagnetic rod includes levitating a diamagnetic rod above a contact line at which a first magnet contacts a second magnet, the first magnet and the second magnet having diametric magnetization in a direction perpendicular to the contact line.

Additional features and advantages are realized through the techniques of the present invention. Other embodiments and aspects of the invention are described in detail. For a better understanding of embodiments of the invention, refer to the description and to the drawings.

BRIEF DESCRIPTION OF THE DRAWINGS

Features characterizing embodiments of the present invention are described in the specification and claims which follow. These features, and advantages of embodiments of the invention are apparent from the following detailed description taken in conjunction with the accompanying drawings in which:

DETAILED DESCRIPTION

Conventional systems and methods have difficulty assembling large numbers of carbon nanotubes or semiconductor wires to form integrated circuits. Carbon nanotubes and most semiconductors are diamagnetic, with magnetic susceptibility $\chi<0$. Embodiments of the invention relate to suspension of diamagnetic rods by diametrically magnetized magnets (magnetic polarization along the diameter of the magnet) to align the diamagnetic rods.

Figure 1:
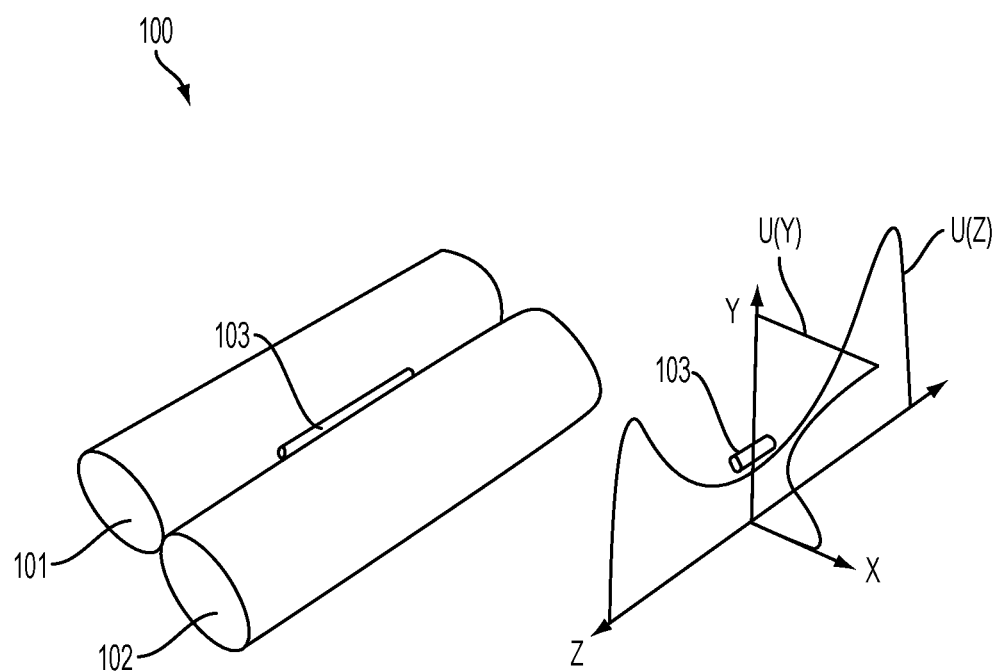
FIG. 1 illustrates a magnetic trap and a graph of potential energy of the magnetic trap according to an embodiment of the invention.
Figures 2A, 2B:
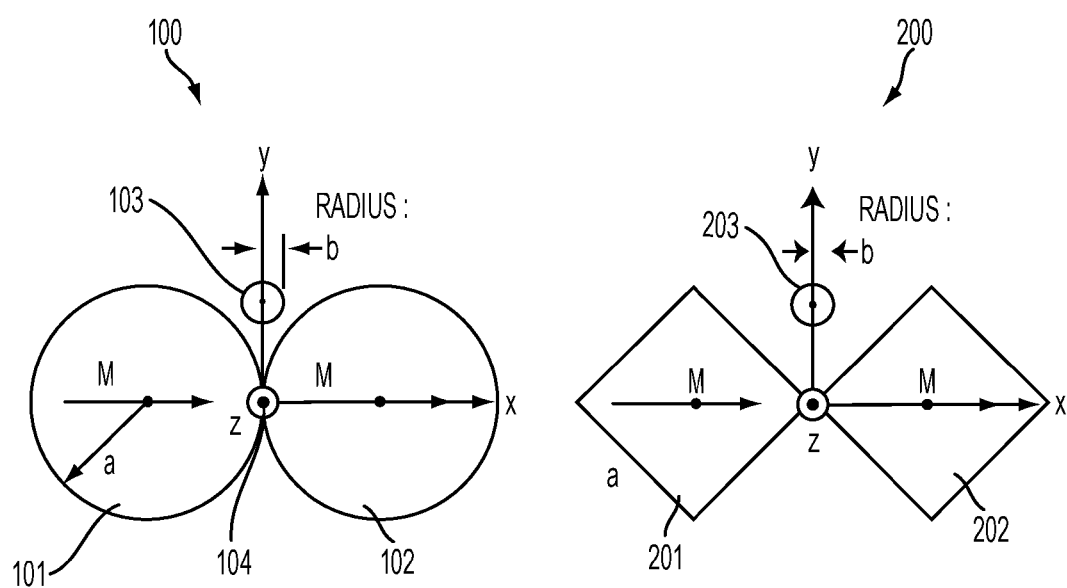
FIG. 2A is a cross-sectional view of a magnetic trap according to one embodiment of the invention.
FIG. 2B is a cross-sectional view of a magnetic trap according to another embodiment of the invention.

FIG. 1A illustrates a magnetic trap 100 according to an embodiment of the invention. FIG. 1B illustrates potential energy that traps the diamagnetic material 103 in the magnetic trap 100. The magnetic trap 100 includes a first magnet 101 and a second magnet 102. A diamagnetic rod 103 or cylinder is positioned above a contact line where the first magnet 101 contacts the second magnet 102. As illustrated in FIG. 2A, the first magnet 101 and the second magnet 102 are diametrically magnetized with volume magnetization M in a width direction x and contact each other at the contact line 104. Because of the finite length of the magnets 101 and 102, i.e. because each of the magnets 101 and 102 has a flat face at each end, the magnets 101 and 102 produce a longitudinal potential U(z) that traps the diamagnetic rod 103 along the longitudinal direction (z) that has a form of "camel-back" potential.

In embodiments of the invention, the diamagnetic rod 103 is trapped in such a way that the rod 103 levitates above the contact line 104 in a vertical direction y, and maintains its location in each of a longitudinal direction z and a lateral or width direction x. In addition, in embodiments of the invention, the first and second magnets 101 and 102 have a uniform shape along the longitudinal direction z. In other words, if the first and second magnets 101 and 102 have a cylindrical shape as illustrated in FIG. 1, then a diameter of the cylinder is uniform along the longitudinal direction z. Similarly, in an embodiment in which the first and second magnets 201 and 202 have a diamond cross-section shape, as illustrated in FIG. 2B, the angles and sides of the first and second magnets 201 and 202 are uniform along the longitudinal direction z. While a circular cross-section shape is illustrated in FIGS. 1A and 2A, and a diamond cross-sectional shape is illustrated in FIG. 2B, embodiments of the invention encompass any cross-sectional shape, as long as the first and second magnets 101 and 102 have a uniform shape along the longitudinal direction z.

In embodiments of the invention, the longitudinal direction z corresponds to a length axis of the diamagnetic rod 103, an origin axis, center length axis or center-of-gravity axis of the first and second magnets 101 and 102 and the contact line 104 where the first magnet 101 contacts the second magnet 102. The first and second magnets 101 and 102 are magnetized diametrically, parallel to the lateral or width axis x and perpendicular to the longitudinal axis z.

Figure 3:
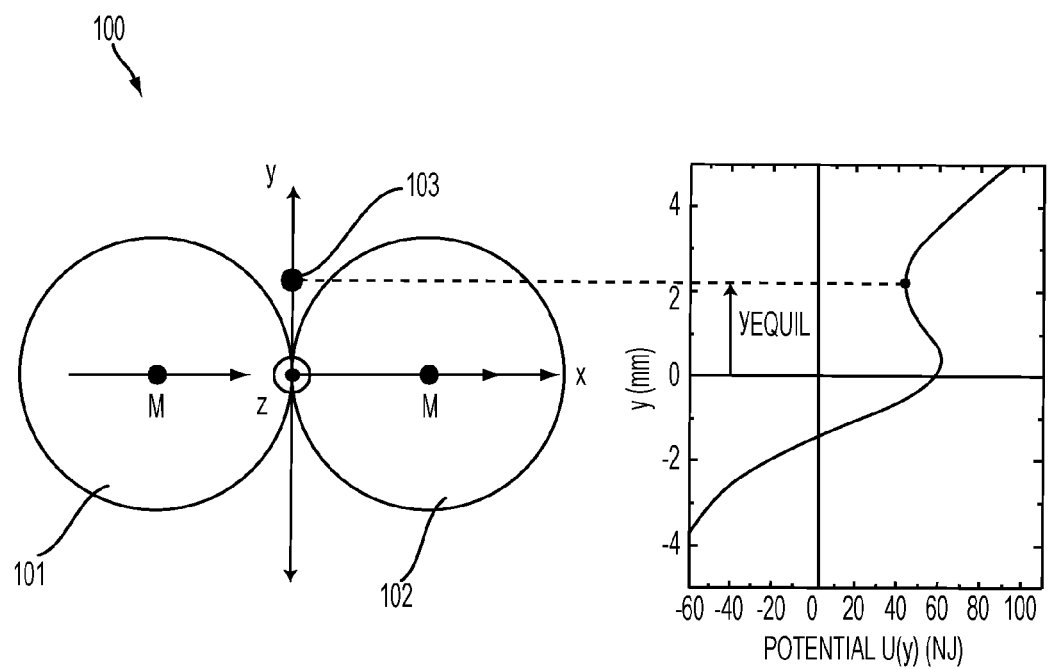
FIG. 3 illustrates a vertical confinement potential of the magnetic trap according to one embodiment.

FIGS. 3A and 3B illustrate a magnetic trap 100 and vertical confinement potential of the magnetic trap 100.

The trapping potential in the vertical direction in the magnetic trap system with cylindrical magnets is given as:

$$U_y(y) = \pi b^2 l \left( \rho_R g y - 2 \frac{\chi}{\chi+2} \mu_0 M^2 \frac{(1-\eta^2)^2}{(1+\eta^2)^2} \right) \quad \text{(Equation 1)}$$

where b is the radius of the rod, l is the length of the rod, $\rho_R$ is the mass density of the rod, $\chi$ is the magnetic susceptibility of the rod, g is the gravitational acceleration, $\mu_0$ is the magnetic permeability in vacuum, M is the volume magnetization of the magnets and $\eta=y/a$, where y is the vertical position of the rod and a is the radius of the magnet.

The equilibrium point $y_{EQ}$ where the rod is trapped or levitates can be obtained by solving for $\eta_{EQ}$ using:

$$\rho_R g a + 8\mu_0 M^2 \frac{\chi}{\chi+2} \frac{\eta_{EQ}(3-\eta_{EQ}^2)(1-\eta_{EQ}^2)}{(1+\eta_{EQ}^2)^5} = 0 \quad \text{(Equation 2)}$$

Figure 4A:
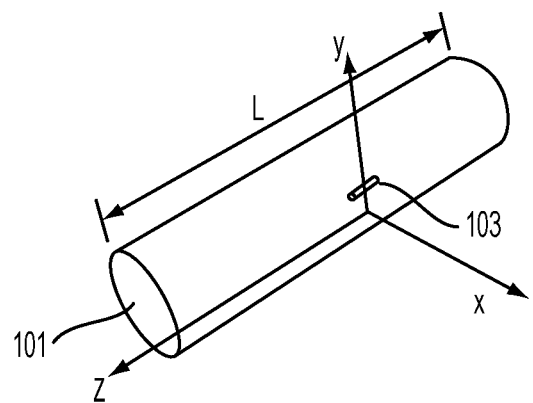
FIG. 4A illustrates one magnet of a magnetic trap according to one embodiment.
Figure 4B:
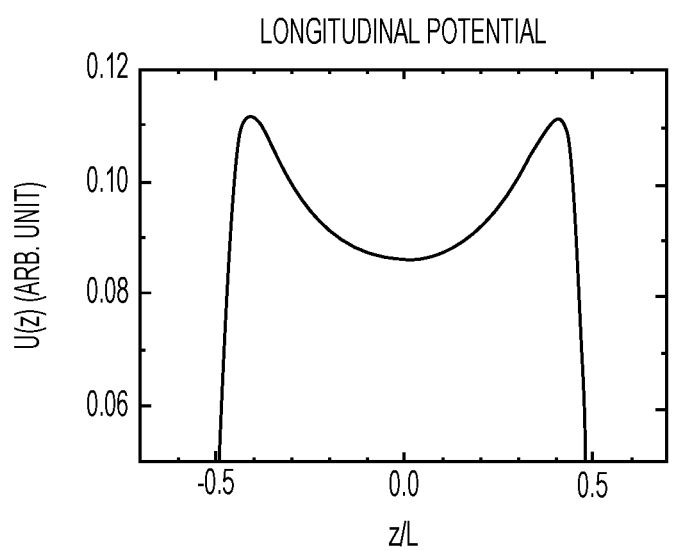
FIG. 4B illustrates a graph of a longitudinal potential of a magnetic trap according to one embodiment.

FIG. 4A illustrates one magnet 101 of a magnetic trap 100 to trap a diamagnetic rod 103 according to one embodiment. One magnet 101 is illustrated, while a contacting magnet (such as magnet 102) is omitted from FIG. 4A, for purposes of description only. FIG. 4B is a graph of a longitudinal potential of a magnetic trap according to embodiments of the invention.

The longitudinal potential is given as:

$$U(z) = \pi b^2 l \left( \rho_R g y_{EQ} - \frac{2}{\mu_0} \frac{\chi}{\chi+2} B_{tot}(z)^2 \right) \quad \text{(Equation 3)}$$

where $B_{tot}(z)=B_1(z)+B_2(z)$ is the magnetic field on the rod using dipole line model approximation, which only has x component with:

$$B_1(z) = -\frac{\mu_0 M a^2}{2(y_{EQ}^2+a^2)} \quad \text{(Equation 4)}$$

$$\left( \frac{L/2-z}{\sqrt{(L/2-z)^2+y_{EQ}^2+a^2}} + \frac{L/2+z}{\sqrt{(L/2+z)^2+y_{EQ}^2+a^2}} \right) \hat{x}$$

and, $$B_2(z) = \frac{\mu_0 M a^4}{2(y_{EQ}^2+a^2)^2} \left( \frac{3(y_{EQ}^2+a^2)(L/2+z)+2(L/2+z)^3}{[(L/2+z)^2+y_{EQ}^2+a^2]^{3/2}} + \frac{3(y_{EQ}^2+a^2)(L/2-z)+2(L/2-z)^3}{[(L/2-z)^2+y_{EQ}^2+a^2]^{3/2}} \right) \hat{x} \quad \text{(Equation 5)}$$

where L is the length of the magnet and $\hat{x}$ is the unit vector along x direction. This longitudinal potential has a form of "camel-back potential" which creates a confinement with a minimum point at the center and two peaks at both ends as shown in FIG. 4B. Accordingly, the diamagnetic rod 103 is trapped in the center of the magnetic trap 100 in a longitudinal direction z.

According to another embodiment, the longitudinal potential may be determined as:

$$U_T(0, y_{EQ}, z) = \pi b^2 l \left( \rho_R g y_{EQ} - \frac{2}{\mu_0} \frac{\chi}{\chi+2} B_T^2(0, y_{EQ}, z) \right)$$

Where, $B_T(0, y, z)$ is the total magnetic field on the rod at the center of the trap (x=0). Due to system symmetry, the magnetic field only has x component. This magnetic field is given as:

$$B_T(y,z)=B_M(a,y,z)+B_M(-a,y,z)$$

where $B_M$ is the magnetic field due to a single cylindrical diametric magnet centered at origin given as:

$$B_M(x, y, z) = \frac{\mu_0 M a}{4\pi} \int_0^{2\pi} \sum_{n=1,2} \frac{(-1)^n}{u_n^2+s^2+u_n\sqrt{u_n^2+s^2}} [x-a\cos\phi, y-a\sin\phi,$$

$$u_n + \sqrt{u_n^2+s^2}] \cos\phi\, d\phi$$

where, L is the length of the magnet, $s^2=(x-a\cos\phi)^2+(y-a\sin\phi)^2$ and $u_{1,2}=z\pm L/2$. As described above, the longitudinal potential has a form of "camel-back potential" which creates a confinement with a minimum point at the center and two peaks at both ends as shown in FIG. 4B. Accordingly, the diamagnetic rod 103 is trapped in the center of the magnetic trap 100 in a longitudinal direction z.

The shape of the camel-back potential determines a length of a diamagnetic rod 103 that may be trapped, since only a diamagnetic rod 103 with a length of less then around eighty percent (80%) but more than ten percent (10%) of the length L of the magnets 101 and 102 could be trapped in stable condition in the magnetic trap 100. Accordingly, in embodiments of the invention, the length L of the magnets 101 and 102 may be selected to filter the length of diamagnetic rods that a user or system desires to trap. The three dimensional confinement in the magnetic trap 100 is exploited to trap and self assemble semiconductor structures which are mostly diamagnetic materials.

This system can also be utilized to measure the magnetic susceptibility of the rod ($\chi$), which is a parameter that that is difficult to measure using other techniques especially for a very small particle. The magnetic susceptibility of a diamagnet has a value of $\chi<0$, while a magnetic susceptibility of a ferromagnet material has a value of $\chi>0$. The camel-back potential of the system gives rise to an oscillation for the rod along the longitudinal (z) direction with a period T. This information can be used to extract the magnetic susceptibility ($\chi$) of the rod using the following approximation:

$$\chi = -\frac{2}{1 + 439 \ \mu_0 M^2 T / 2\pi^2 \rho_R} \quad \text{(Equation 6)}$$

According to another embodiment, the magnetic susceptibility of the rod may be determined using a more exact expression as:

$$\chi = -\frac{2}{1 + \alpha \ \mu_0 M^2 T / 4\pi^2 \rho_R L^2}$$

where $\alpha$ is a dimensionless geometric parameter defined as:

$$\alpha = 2L^2/\mu_0^2 M^2 \times \partial^2 B_T^2(0, y_{EQ}, 0)/\partial z^2$$

Figure 5A:
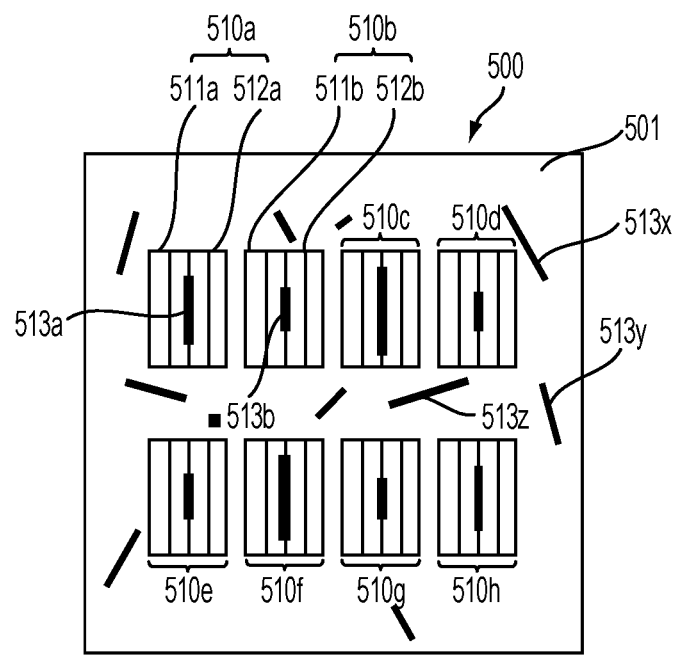
FIG. 5A illustrates one view of deposition of diamagnetic materials on a magnetic trap array according to an embodiment of the invention.

FIGS. 5A to 7 illustrate a process for positioning diamagnetic rods on a substrate according to one embodiment of the invention. FIG. 8 illustrates a flowchart of a method according to an embodiment of the invention. FIGS. 5A and 5B illustrate a magnetic trap assembly 500 at a stage where diamagnetic rods are trapped by magnetic traps.

In block 801 of FIG. 8, diamagnetic rods 513 or wires, including semiconductor nanowires or carbon nanotubes may be deposited on a substrate 501 including a plurality of magnetic traps 510a to 510h that form a magnetic trap array. The magnetic traps 510a to 510h may be arranged in any manner and may have any length to correspond to desired arrangements and lengths of the diamagnetic rods 513 in a circuit. The diamagnetic rods 513 may be deposited by applying a solution to the substrate 501, dipping the substrate 501 in a solution or by any other method. Rods 513 of predetermined lengths, based on the lengths of the magnets 511 and 512 of the magnetic traps 510a to 510h, are trapped in the magnetic traps 510a to 510h, and the remaining rods are left on a surface of the substrate 510.

In FIG. 5A, a first magnetic trap 510a includes a first magnet 511a contacting a second magnet 512a, and a first diamagnetic rod 513a is trapped by the magnetic trap 510a. A second magnetic trap 510b includes a first magnet 511b contacting a second magnet 512b, and a second diamagnetic rod 513b is trapped by the magnetic trap 510b. The first and second magnetic traps 510a and 510b are described in detail by way of example, and each of the magnetic traps 510c to 510h includes the first magnet 511 and the second magnet 512. In FIG. 5A, reference numerals 513x, 513y and 513z are used to illustrate three examples of non-trapped diamagnetic rods 513.

Figure 5B:
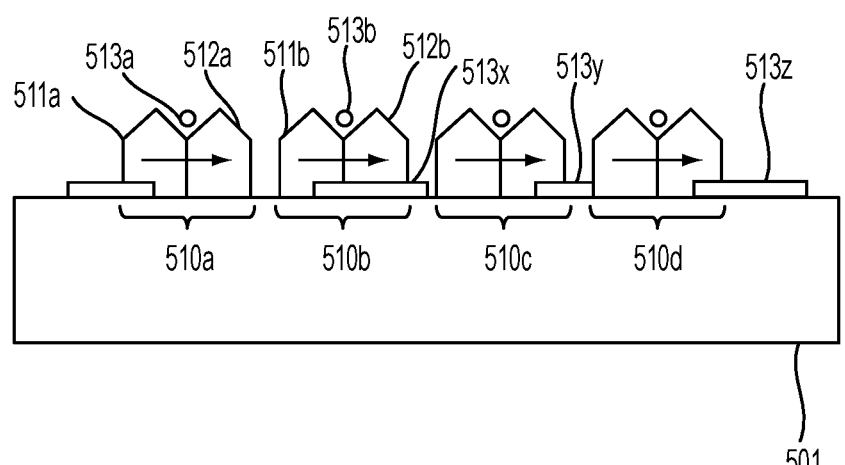
FIG. 5B illustrates another view of deposition of diamagnetic materials on a magnetic trap array according to an embodiment of the invention.

As illustrated in FIG. 5B, the first and second magnets 511 and 512 of the magnetic traps 510 may have any cross-sectional shape, including a house shape, or a shape of a combined rectangle and triangle, as long as the first and second magnets 511 and 512 have a uniform shape along a longitudinal axis corresponding to the length of the first and second magnets 511 and 512.

Figure 5C:
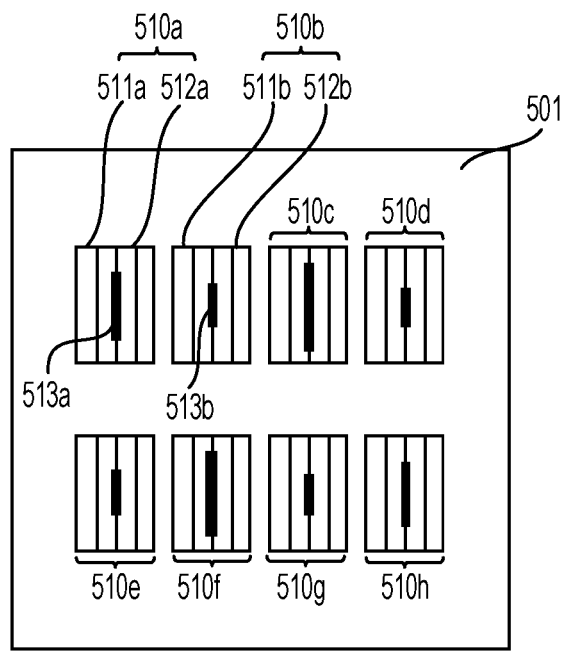
FIG. 5C illustrates one view of cleaning non-captured diamagnetic materials from a magnetic trap array according to one embodiment.
Figure 5D:
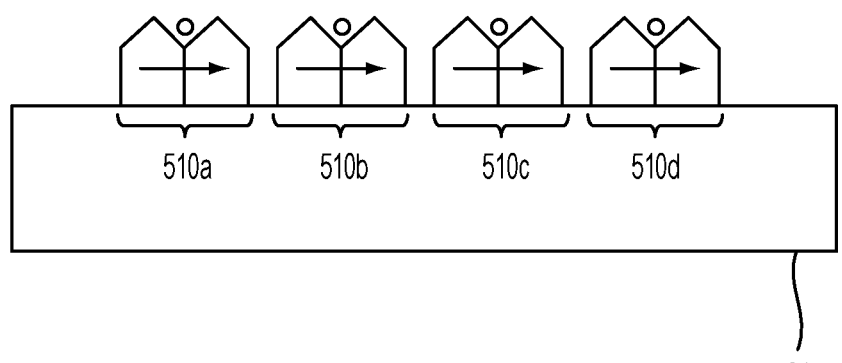
FIG. 5D illustrates another view of cleaning non-captured diamagnetic materials from a magnetic trap array according to one embodiment.

In block 802 of FIG. 8, and referring to FIGS. 5C and 5D, the non-trapped wires 513, including the wires 513x, 513y and 513z of FIG. 5A, may be removed from the substrate 501, such as by application of a liquid solution to the substrate 501, by gentle agitation of the substrate 501 or by any other cleaning method.

Figure 6A:
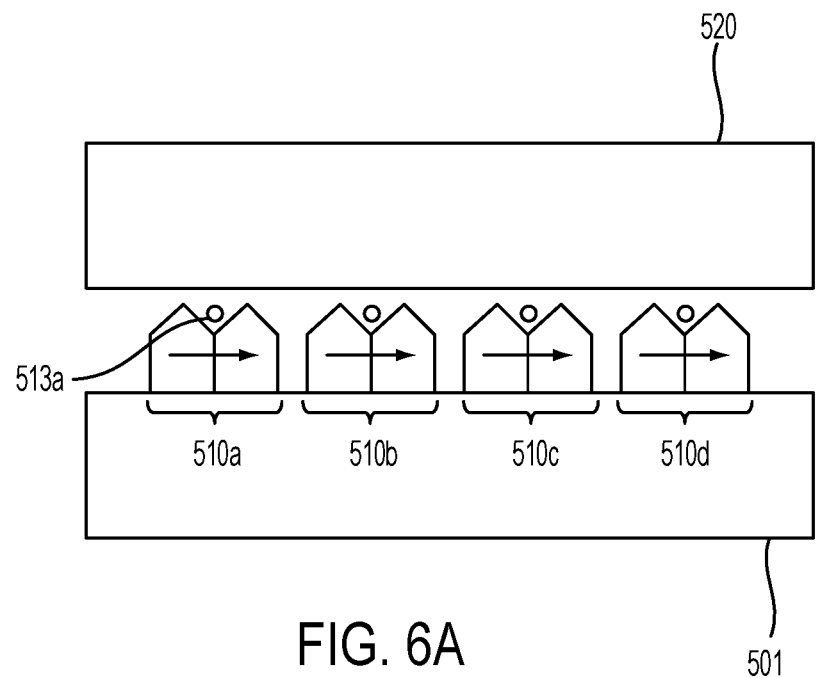
FIG. 6A illustrates a first stage of transferring diamagnetic materials to a target substrate according to one embodiment.
Figure 6B:
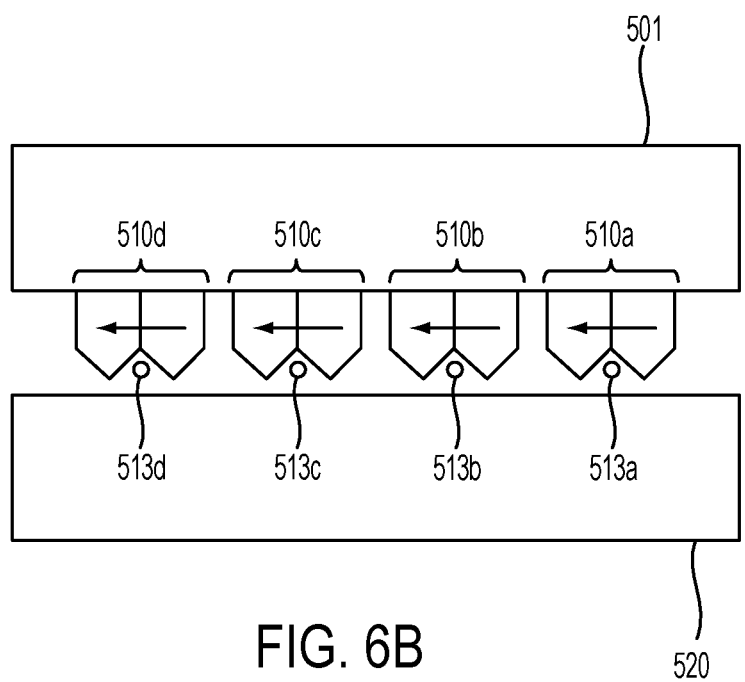
FIG. 6B illustrates a second stage of transferring diamagnetic materials to a target substrate according to one embodiment.

In block 803 of FIG. 8, the diamagnetic materials captured in the magnetic traps 510a to 510h are transferred to a target substrate. Referring to FIG. 6A, a target substrate 520, may be brought into proximity with the magnetic traps 510 and the diamagnetic rods 513. In one embodiment, the target substrate is treated such that contact with the diamagnetic rods 513 results in the diamagnetic rods adhering to a surface of the target substrate 520. As illustrated in FIG. 6B, the substrate 501 may be inverted over the target substrate 520 to apply the diamagnetic rods 513 to the target substrate 520.

In one embodiment, the diamagnetic rods 513 are carbon nanotubes wrapped in a surfactant and are selectively placed on the target substrate 520 based on an ion exchange between a functional surface monolayer and the surfactant-wrapped carbon nanotubes in an aqueous solution. Strong electrostatic interaction between the surface monolayer and the nanotube surfactant leads to the placement of individual nanotubes. In one embodiment, the monolayer is formed of 4-(N-hydroxycarboxamido)-1-methylpyridinium iodide (NMPI) molecules. The monolayer may include a hydroxamic acid end group that self-assembles on metal oxide surfaces, but not silicon dioxide ($SiO_2$). An anion of NMPI may be exchanged with the anionic surfactant wrapped around the nanotubes, which results in a strong coulombic attraction between a negatively charged surfactant and a positively charged monolayer.

Figure 7:
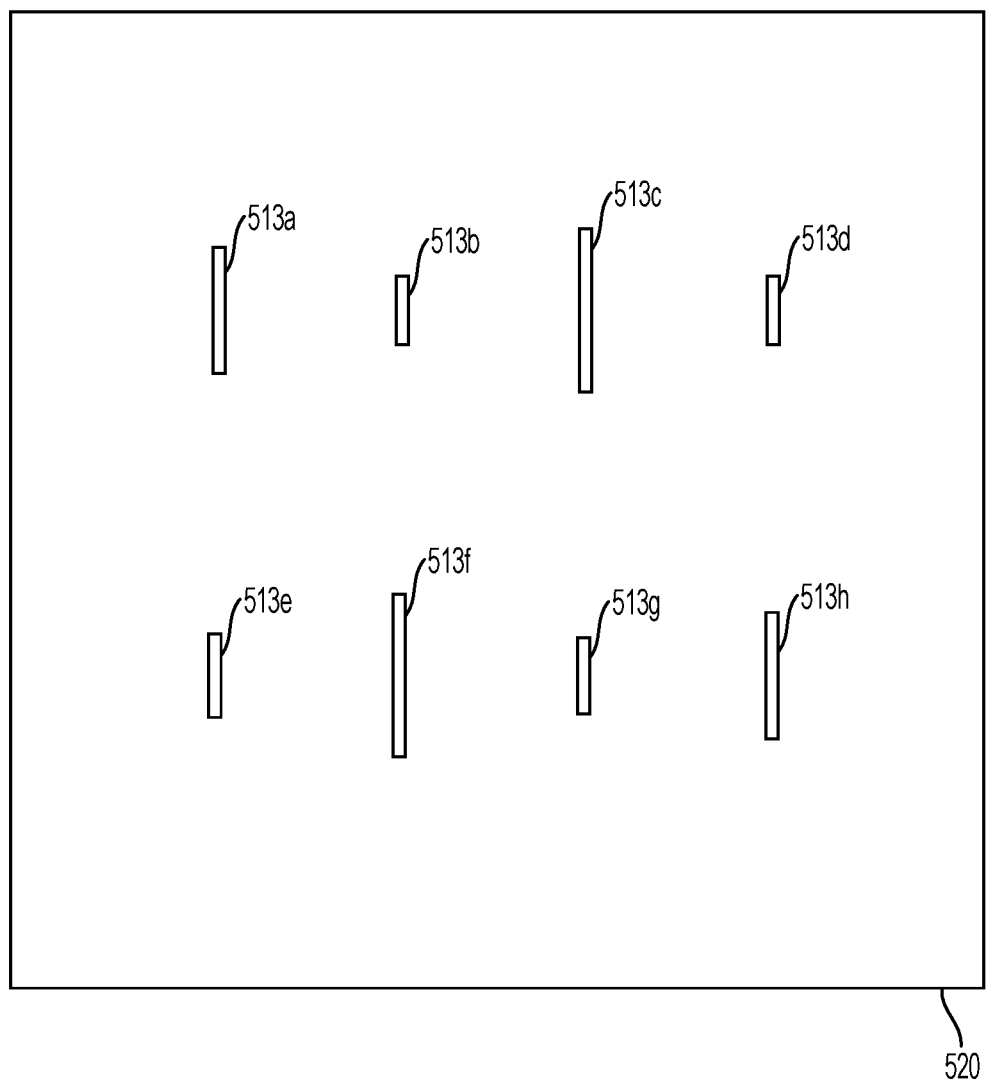
FIG. 7 illustrates diamagnetic rods transferred to a target substrate.
Figure 8:
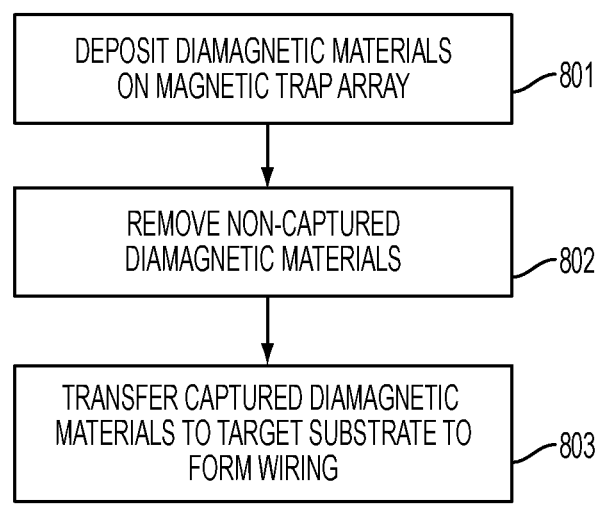
FIG. 8 is a flowchart illustrating a method according to an embodiment of the invention.

As illustrated in FIG. 7, the diamagnetic rods 513a to 513h may adhere to the target substrate 520 to form wiring for an integrated circuit, for example.

Embodiments of the present invention trap diamagnetic wires or rods with magnets or ferromagnets. The diamagnetic wires or rods may then be applied to a substrate to form the basis for an integrated circuit. Embodiments include a system to trap and filter cylindrical diamagnetic materials or rods including pair of magnets, such as cylindrical magnets, block magnets, or thin film magnets. The magnets have diametric magnetization, i.e., the magnetization is along the diameter of the magnets, perpendicular to the direction of the trapped rods. The magnets have a finite length and flat faces on both ends to create longitudinal confinement of the rods. The magnets are designed to capture rods of predetermined lengths, where only rods having a length between around 10% and 80% of the magnets may be trapped.

Embodiments also include an array of magnetic traps on a substrate to form a template for self-assembly of diamagnetic materials, such as semiconductor nanowires or carbon nanotubes. Embodiments also include methods for performing self-assembly of diamagnetic materials including depositing cylindrical diamagnetic materials on an array of magnetic traps, cleaning or filtering non-assembled diamagnetic materials and transferring the captured diamagnetic materials to a substrate to form wiring for a semiconductor circuit.

As will be appreciated by one skilled in the art, aspects of the present invention may be embodied as an apparatus, system, method or computer program product. For example, the method of capturing diamagnetic materials and forming wiring may be performed by a system controlled by a computer executing computer code that controls the system to execute the method. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the disclosure in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While a preferred embodiment has been described, it will be understood that those skilled in the art, both now and in the future, may make various improvements and enhancements which fall within the scope of the claims which follow.

What is claimed is:

1. A magnetic trap configured to arrange at least one diamagnetic rod, the magnetic trap comprising:
    first and second magnets on a substrate that forms the magnetic trap defining a template configured to self-assemble diamagnetic material, each of the first and second magnets extending along a longitudinal direction to define magnet lengths, respectively, wherein the first magnet contacts the second magnet to define a contact line,
    wherein the first magnet and the second magnet have a diametric magnetization in a direction perpendicular to the contact line and the longitudinal direction so as to generate a longitudinal energy potential that traps the diamagnetic rod along the longitudinal direction, the longitudinal energy potential having a camel-back shaped energy profile,
    wherein the longitudinal energy potential confines the diamagnetic rod in a three-dimensional confinement within the magnetic trap to perform a self-assembling process, and
    wherein the first and second magnets position the diamagnetic rod being levitated above the contact line against a target substrate to form wiring on the target substrate.

2. The magnetic trap of claim 1, wherein the first magnet and the second magnet form one magnetic trap among an array of magnetic traps mounted on a template substrate.

3. The magnetic trap of claim 1, wherein the magnet lengths filter a rod length of the diamagnetic rod based on the magnet lengths.

4. The magnetic trap of claim 1, wherein the camel-back shaped energy profile includes a trough region interposed between a pair of peak regions.

5. The magnetic trap of claim 4, wherein the longitudinal energy potential confines the diamagnetic rod between the peak regions.

6. The magnetic trap of claim 5, wherein the diamagnetic rod is levitated at approximately the trough portion.

7. The magnetic trap of claim 6, wherein the camel-back shaped energy profile determines a length of the diamagnetic rod.

8. The magnetic trap of claim 7, wherein the camel-back shaped energy profile determines the rod length of the trapped diamagnetic rod with respect to the magnet lengths.

9. The magnetic trap of claim 1, wherein the first magnet has a first outer surface extending along the magnet lengths between respective opposing ends, and the second magnet has a second outer surface extending along the magnet lengths between respective opposing ends, and wherein the first outer surface of the first magnet is in continuous direct contact with the second outer surface of the second magnet.

10. A magnetic trap configured to arrange at least one diamagnetic rod, the magnetic trap comprising:
    first and second magnets on a substrate that forms the magnetic trap defining a template configured to self-assemble diamagnetic material, each of the first and second magnets extending along a longitudinal direction to define magnet lengths, respectively, wherein the first magnet contacts the second magnet to define a contact line,
    wherein the first magnet and the second magnet have a diametric magnetization in a direction perpendicular to the contact line and the longitudinal direction so as to generate a longitudinal energy potential that traps the diamagnetic rod along the longitudinal direction, the longitudinal energy potential having a camel-back shaped energy profile,
    wherein the first magnet has a first outer surface extending along the magnet lengths between respective opposing ends, and the second magnet has a second outer surface extending along the magnet lengths between respective opposing ends, and wherein the first outer surface of the first magnet is in continuous direct contact with the second outer surface of the second magnet.

* * * * *